US011970770B2

United States Patent
Seo et al.

(10) Patent No.: US 11,970,770 B2
(45) Date of Patent: Apr. 30, 2024

(54) SUBSTRATE PROCESSING APPARATUS HAVING EXHAUST GAS DECOMPOSER, AND EXHAUST GAS PROCESSING METHOD THEREFOR

(71) Applicant: JUSUNG ENGINEERING CO., LTD., Gwangju-si (KR)

(72) Inventors: Dong Won Seo, Gwangju-si (KR); Heon Do Kim, Gwangju-si (KR); Chul-Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 0 days.

(21) Appl. No.: 17/709,396

(22) Filed: Mar. 30, 2022

(65) Prior Publication Data

US 2022/0220613 A1    Jul. 14, 2022

Related U.S. Application Data

(62) Division of application No. 17/024,675, filed on Sep. 17, 2020, now Pat. No. 11,371,142, which is a (Continued)

(30) Foreign Application Priority Data

Oct. 5, 2015    (KR) .......................... 10-2015-0139794

(51) Int. Cl.
*C23C 16/40*    (2006.01)
*C23C 16/44*    (2006.01)
(Continued)

(52) U.S. Cl.
CPC ...... *C23C 16/4412* (2013.01); *C23C 16/4408* (2013.01); *H01L 21/67017* (2013.01); (Continued)

(58) Field of Classification Search
CPC ... C23C 16/50; C23C 16/509; C23C 16/4584; C23C 16/45565; C23C 16/45563; (Continued)

(56) References Cited

U.S. PATENT DOCUMENTS 5,091,207 A    2/1992  Tanaka
5,137,701 A    8/1992  Mundt
(Continued)

FOREIGN PATENT DOCUMENTS

JP    2002151489 A    5/2002
JP    2010141248 A    6/2010
(Continued)

*Primary Examiner* — Rudy Zervigon
(74) *Attorney, Agent, or Firm* — Renaissance IP Law Group LLP

(57) ABSTRACT

Disclosed is a substrate processing apparatus and the method of processing an exhaust gas. The substrate processing apparatus and the method of processing an exhaust gas according to the present invention, an exhaust gas decomposition module may decompose a source gas exhausted from a process chamber to decompose a ligand of the source gas. Also, the ligand and the source gas of which the ligand has been decomposed may be put in a stabilized state by reacting with separately supplied $O_2$, $N_2O$, or $O_3$, and then, may be changed to a mixed gas including a reactant gas mixed therewith. Subsequently, the mixed gas may flow into the exhaust pump and may be emitted. Alternatively, the ligand and the source gas may be mixed with the reactant gas and may be emitted. Therefore, the ligand and the source gas of which the ligand has been decomposed may not react with the reactant gas or heat which occurs in the exhaust pump, and thus, the ligand-decomposed source gas and the ligand flowing into the exhaust pump are not deposited on an inner surface of the exhaust pump. Also, the ligand-decomposed source gas and ligands piled in the exhaust pump are not exploded.

6 Claims, 4 Drawing Sheets

Related U.S. Application Data division of application No. 15/766,000, filed as application No. PCT/KR2016/011045 on Oct. 4, 2016, now Pat. No. 10,808,315.

(51) Int. Cl.
 *H01L 21/67* (2006.01)
 *H01L 21/687* (2006.01)

(52) U.S. Cl.
 CPC .. *H01L 21/68764* (2013.01); *H01L 21/68771* (2013.01); *B01D 2258/0216* (2013.01)

(58) Field of Classification Search
 CPC ............ C23C 16/455; C23C 16/45551; C23C 16/458; C23C 16/40; C23C 16/45544; C23C 16/45536; C23C 16/54; C23C 16/545; C23C 16/4412; C23C 14/568; C23C 16/4401; C23C 16/4408; H01J 37/32568; H01J 37/32623; H01J 37/3244; H01J 37/32541; H01J 37/32633; H01J 37/32733; H01J 37/32009; H01J 37/32091; H01J 37/32899; H01L 21/6719; H01L 21/67196; H01L 21/67201; H01L 21/67173; H01L 21/67184; H01L 21/6776; H01L 21/67161; H01L 21/67155; H01L 21/67017; H01L 21/67069; H01L 21/67748; H01L 21/67751; H01L 21/67745; H01L 21/68771; H01L 21/68764
 USPC ............... 118/730, 719; 156/345.55, 345.31, 156/345.32
 See application file for complete search history.

(56) References Cited

U.S. PATENT DOCUMENTS

| | | |
|---|---|---|
| 5,772,770 A | 6/1998 | Suda et al. |
| 5,891,350 A | 4/1999 | Shan et al. |
| 5,904,757 A | 5/1999 | Hayashi et al. |
| 5,928,426 A | 7/1999 | Aitchison |
| 5,951,772 A | 9/1999 | Matsuse et al. |
| 5,965,034 A | 10/1999 | Vinogradov et al. |
| 6,045,618 A | 4/2000 | Raoux et al. |
| 6,059,885 A | 5/2000 | Ohashi et al. |
| 6,156,107 A | 12/2000 | Hayashi et al. |
| 6,193,802 B1 | 2/2001 | Pang et al. |
| 6,194,628 B1 | 2/2001 | Pang et al. |
| 6,255,222 B1 | 7/2001 | Xia et al. |
| 6,366,346 B1 | 4/2002 | Nowak et al. |
| 6,367,412 B1 | 4/2002 | Ramaswamy et al. |
| 6,391,146 B1 | 5/2002 | Bhatnagar et al. |
| 6,402,806 B1 | 6/2002 | Schmitt et al. |
| 6,541,353 B1 | 4/2003 | Sandhu et al. |
| 6,592,817 B1 | 7/2003 | Tsai et al. |
| 6,673,323 B1 | 1/2004 | Bhatnagar et al. |
| 6,680,420 B2 | 1/2004 | Pang et al. |
| 6,773,687 B1 | 8/2004 | Hasegawa |
| 6,806,211 B2 | 10/2004 | Shinriki et al. |
| 6,843,882 B2 | 1/2005 | Janakiraman et al. |
| 6,858,264 B2 | 2/2005 | Dando et al. |
| 6,863,019 B2 | 3/2005 | Shamouilian et al. |
| 6,911,092 B2 | 6/2005 | Sneh |
| 6,966,936 B2 | 11/2005 | Yamasaki et al. |
| 7,020,981 B2 | 4/2006 | Shero et al. |
| 7,021,903 B2 | 4/2006 | Bailey et al. |
| 7,022,298 B2 | 4/2006 | Hasegawa |
| 7,083,903 B2 | 8/2006 | Edelberg et al. |
| 7,169,540 B2 | 1/2007 | Schilling |
| 7,276,122 B2 | 10/2007 | Devine et al. |
| 7,383,841 B2 | 6/2008 | Shinriki et al. |
| 7,408,225 B2 | 8/2008 | Shinriki et al. |
| 7,435,445 B2 | 10/2008 | Shin et al. |
| 7,647,886 B2 | 1/2010 | Kubista et al. |
| 7,763,115 B2 | 7/2010 | Hatanaka et al. |
| 7,828,900 B2 | 11/2010 | Hatanaka et al. |
| 7,845,309 B2 | 12/2010 | Condrashoff et al. |
| 8,268,181 B2 | 9/2012 | Srivastava et al. |
| 8,293,013 B2 | 10/2012 | DeDontney |
| 8,349,283 B2 | 1/2013 | Hara et al. |
| 8,551,288 B2 | 10/2013 | Kim et al. |
| 8,580,076 B2 | 11/2013 | Becknell et al. |
| 8,617,347 B2 | 12/2013 | Kim et al. |
| 8,790,489 B2 | 7/2014 | Honda et al. |
| 8,932,430 B2 | 1/2015 | Srivastava et al. |
| 9,129,778 B2 | 9/2015 | Huseinovic et al. |
| 9,490,152 B2 | 11/2016 | Wang et al. |
| 9,657,757 B2 | 5/2017 | Yang et al. |
| 9,732,424 B2 | 8/2017 | Lee et al. |
| 9,779,918 B2 | 10/2017 | Lee |
| 9,852,905 B2 | 12/2017 | Sung |
| 9,896,761 B2 | 2/2018 | Hara et al. |
| 9,920,425 B2 | 3/2018 | Matsui et al. |
| 9,970,106 B2 | 5/2018 | Goeres et al. |
| 9,997,325 B2 | 6/2018 | Hosch et al. |
| 10,240,232 B2 | 3/2019 | Liang et al. |
| 10,381,200 B2 | 8/2019 | Nguyen et al. |
| 10,502,651 B2 | 12/2019 | Yang |
| 10,626,500 B2 | 4/2020 | Shah et al. |
| 10,669,631 B2 | 6/2020 | Kim et al. |
| 10,808,315 B2 | 10/2020 | Seo et al. |
| 11,078,568 B2 | 8/2021 | Ghosh et al. |
| 2002/0066535 A1 | 6/2002 | Brown et al. |
| 2003/0141016 A1 | 7/2003 | Okase et al. |
| 2003/0164225 A1 | 9/2003 | Sawayama et al. |
| 2004/0026037 A1* | 2/2004 | Shinriki ............ C23C 16/45561 438/785 |
| 2004/0052972 A1* | 3/2004 | Schmitt ................... C30B 25/02 118/715 |
| 2004/0081607 A1 | 4/2004 | Hasegawa |
| 2004/0129224 A1 | 7/2004 | Yamazaki |
| 2004/0161533 A1 | 8/2004 | Sawayama et al. |
| 2004/0235299 A1 | 11/2004 | Srivastava et al. |
| 2004/0238123 A1 | 12/2004 | Becknell et al. |
| 2004/0250765 A1 | 12/2004 | Ishizaka et al. |
| 2005/0241176 A1* | 11/2005 | Shero ................... C23C 16/4412 134/1.1 |
| 2006/0107973 A1 | 5/2006 | Leung |
| 2006/0177579 A1 | 8/2006 | Shin et al. |
| 2006/0191636 A1 | 8/2006 | Choi |
| 2007/0074662 A1 | 4/2007 | Hirota |
| 2007/0160757 A1 | 7/2007 | Ishizaka et al. |
| 2007/0207625 A1* | 9/2007 | Aggarwal ........... C23C 16/4412 438/758 |
| 2007/0251452 A1 | 11/2007 | Tanaka et al. |
| 2007/0286766 A1 | 12/2007 | Choi |
| 2008/0014345 A1 | 1/2008 | Sawayama et al. |
| 2008/0202423 A1 | 8/2008 | Hatanaka et al. |
| 2009/0084500 A1 | 4/2009 | Sawayama et al. |
| 2009/0095420 A1 | 4/2009 | Sawayama et al. |
| 2009/0114155 A1 | 5/2009 | Sawayama et al. |
| 2009/0145555 A1 | 6/2009 | Sawayama et al. |
| 2009/0203223 A1 | 8/2009 | Suzuki et al. |
| 2010/0043888 A1 | 2/2010 | Sneh |
| 2010/0055807 A1 | 3/2010 | Srivastava et al. |
| 2010/0190341 A1 | 7/2010 | Park et al. |
| 2011/0136346 A1 | 6/2011 | Geissbühler et al. |
| 2012/0024449 A1 | 2/2012 | Ricci et al. |
| 2012/0132619 A1 | 5/2012 | Matsuda et al. |
| 2012/0222813 A1 | 9/2012 | Pal et al. |
| 2013/0213574 A1* | 8/2013 | Sankarakrishnan .. B08B 7/0021 156/345.31 |
| 2015/0056386 A1 | 2/2015 | Suzuki et al. |
| 2015/0176124 A1 | 6/2015 | Greer et al. |
| 2015/0235816 A1 | 8/2015 | Yun et al. |
| 2015/0252473 A1 | 9/2015 | Dickinson |
| 2016/0053368 A1 | 2/2016 | Lee et al. |
| 2016/0130710 A1 | 5/2016 | Kaihara et al. |
| 2016/0273541 A1 | 9/2016 | Yang et al. |
| 2016/0369395 A1 | 12/2016 | Liang et al. |

(56) References Cited

U.S. PATENT DOCUMENTS

| | | |
|---|---|---|
| 2017/0218515 A1* | 8/2017 | Shin .................... C23C 16/4412 |
| 2018/0073137 A1 | 3/2018 | Xavier et al. |
| 2018/0305815 A1 | 10/2018 | Seo et al. |
| 2019/0035607 A1 | 1/2019 | Kim et al. |
| 2019/0226083 A1 | 7/2019 | Dickinson |
| 2019/0273004 A1 | 9/2019 | Ueda |
| 2020/0075297 A1 | 3/2020 | Oishi et al. |

FOREIGN PATENT DOCUMENTS

| | | | |
|---|---|---|---|
| JP | 2014116484 A | 6/2014 | |
| KR | 20040085153 A | 10/2004 | |
| KR | 20100077444 A | 7/2010 | |
| KR | 20110038130 A | 4/2011 | |
| KR | 20130074413 A | 7/2013 | |
| KR | 101505184 B1 | 3/2015 | |
| KR | 20150140786 A | 12/2015 | |
| KR | 10-1620053 * | 5/2016 | ........... C23C 16/455 |
| TW | 200901287 A | 1/2009 | |

\* cited by examiner

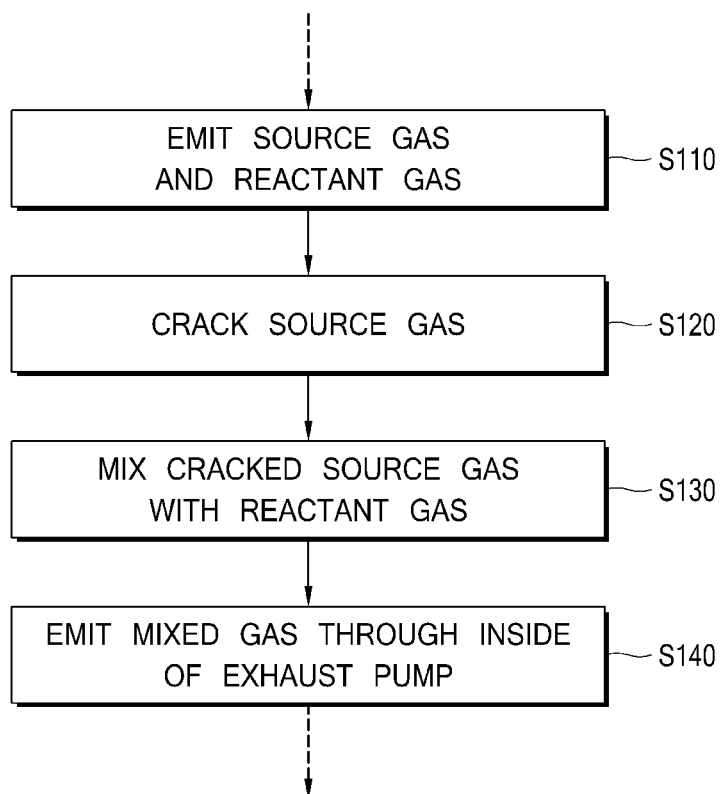

SUBSTRATE PROCESSING APPARATUS HAVING EXHAUST GAS DECOMPOSER, AND EXHAUST GAS PROCESSING METHOD THEREFOR

CROSS-REFERENCE TO RELATED APPLICATION

This application is a divisional of U.S. patent application Ser. No. 17/024,675, filed on Sep. 17, 2020, which is a divisional of U.S. patent application Ser. No. 15/766,000, filed on 4 Apr. 2018, now U.S. Pat. No. 10,808,315, issued on Oct. 10, 2020, which claims priority under 35 U.S.C. § 371 to International Patent Application No. PCT/KR2016/011045, filed on Oct. 4, 2016, and to 35 U.S.C. § 119 to Korean Patent Application No. 10-2015-0139794, filed on Oct. 5, 2015, in the Korean Intellectual Property Office, the contents of both which are herein incorporated by reference in their entireties.

TECHNICAL FIELD

The present invention relates to a substrate processing apparatus having exhaust gas decomposer and an exhaust gas processing method therefor, which decompose a source gas emitted from a process chamber to prevent an exhaust pump from being damaged by an exhaust gas.

DESCRIPTION OF THE RELATED ART

Semiconductor devices, flat panel display devices, or solar cells are manufactured by a thin film deposition process of depositing a source material on a substrate such as a silicon wafer or glass, a photolithography process of exposing or covering a selected area in thin films which are deposited by using a photosensitive material, and an etching process of removing a thin film in a selected area to perform desired patterning.

Examples of the thin film deposition process include a physical vapor deposition (PVD) process, a chemical vapor deposition (CVD) process, and an atomic layer deposition (ALD) process.

The thin film deposition process deposits a thin film on a substrate by using various materials. In this case, only the small amount of a source gas which is a precursor flowing into a process chamber including a space for processing a substrate is used in a deposition process, and most of the source gas is emitted to outside the process chamber along with a byproduct which occurs in the deposition process.

A source gas and a byproduct of the process chamber which are not used in the deposition process are emitted to outside the process chamber by an exhaust line and an exhaust pump. That is, the source gas and the byproduct of the process chamber which are not used in the deposition process are extracted by the exhaust pump and are emitted to outside the exhaust pump through the exhaust line and the exhaust pump.

Moreover, the source gas which is not used in the deposition process is decomposed by reacting with heat occurring in the exhaust pump and a reactant gas emitted from the process chamber, and the decomposed source gas is deposited on an inner surface of the exhaust pump to form a thin film. In this case, clearance between elements configuring the exhaust pump is changed, and for this reason, the exhaust pump is damaged.

When a source gas which is for a low temperature and is emitted to outside the process chamber is piled in the exhaust pump, the source gas can be exploded by heat which occurs in the exhaust pump.

SUMMARY

An aspect of the present invention is directed to provide a substrate processing apparatus having exhaust gas decomposer and an exhaust gas processing method therefor, which solve all of the above-described problems of the related art.

Another aspect of the present invention is directed to provide a substrate processing apparatus having exhaust gas decomposer and an exhaust gas processing method therefor, which decompose a source gas which is emitted from a process chamber and is not used in a deposition process, and emit the decomposed source gas through an exhaust pump, thereby preventing the exhaust pump from being damaged by the source gas and perfectly preventing the source gas from being exploded.

Technical Solution

A substrate processing apparatus including: a process chamber including a space where a substrate is processed; a substrate supporting means installed in the process chamber, the substrate being disposed on the substrate supporting means; a source gas distribution means distributing a source gas to the substrate; a reactant gas distribution means distributing a reactant gas to the substrate; a source gas exhaust line guiding the source gas of the process chamber to be emitted to outside the process chamber; a reactant gas exhaust line guiding the reactant gas of the process chamber to be emitted to outside the process chamber; an exhaust pump communicating with each of the source gas exhaust line and the reactant gas exhaust line to respectively exhaust the source gas and the reactant gas to the source gas exhaust line and the reactant gas exhaust line; and an exhaust gas decomposition module installed in the source gas exhaust line between the process chamber and the exhaust pump to decompose the source gas which flows into the exhaust pump through the source gas exhaust line.

In another aspect of the present invention, there is provided an exhaust gas processing method of a substrate processing apparatus, exhausting and processing a source gas and a reactant gas, which are not used in a deposition process, in a source gas and a reactant gas which are distributed to a process chamber where a substrate is processed and deposit a thin film on the substrate, including: respectively exhausting a source gas and a reactant gas to a source gas exhaust line and a reactant gas exhaust line by using an exhaust pump, one side of the source gas exhaust line communicating with the process chamber, the other side of the source gas exhaust line communicating with the exhaust pump, one side of the reactant gas exhaust line communicating with the process chamber, the other side of the reactant gas exhaust line communicating with the exhaust pump; decomposing the source gas flowing into the source gas exhaust line; and emitting a mixed gas, which is generated by mixing the decomposed source gas of the source gas exhaust line with the reactant gas of the reactant gas exhaust line, through the inside of the exhaust pump.

Advantageous Effects

In the substrate processing apparatus and the method of processing an exhaust gas according to an embodiment of the present invention, the exhaust gas decomposition module may decompose a source gas exhausted from the process chamber to decompose a ligand of the source gas. Also, the ligand and the source gas of which the ligand has been decomposed may be put in a stabilized state by reacting with separately supplied $O_2$, $N_2O$, or $O_3$, and then, may be changed to a mixed gas including a reactant gas mixed therewith. Subsequently, the mixed gas may flow into the exhaust pump and may be emitted. Alternatively, the ligand and the source gas may be mixed with the reactant gas and may be emitted. Therefore, the ligand and the source gas of which the ligand has been decomposed may not react with the reactant gas or heat which occurs in the exhaust pump, and thus, the ligand-decomposed source gas and the ligand flowing into the exhaust pump are not deposited on an inner surface of the exhaust pump. Also, the ligand-decomposed source gas and ligands piled in the exhaust pump are not exploded.

BRIEF DESCRIPTION OF THE DRAWINGS

FIG. 4 is a flowchart illustrating an exhaust gas processing method of a substrate processing apparatus according to an embodiment of the present invention.

DETAILED DESCRIPTION

Figure 1:
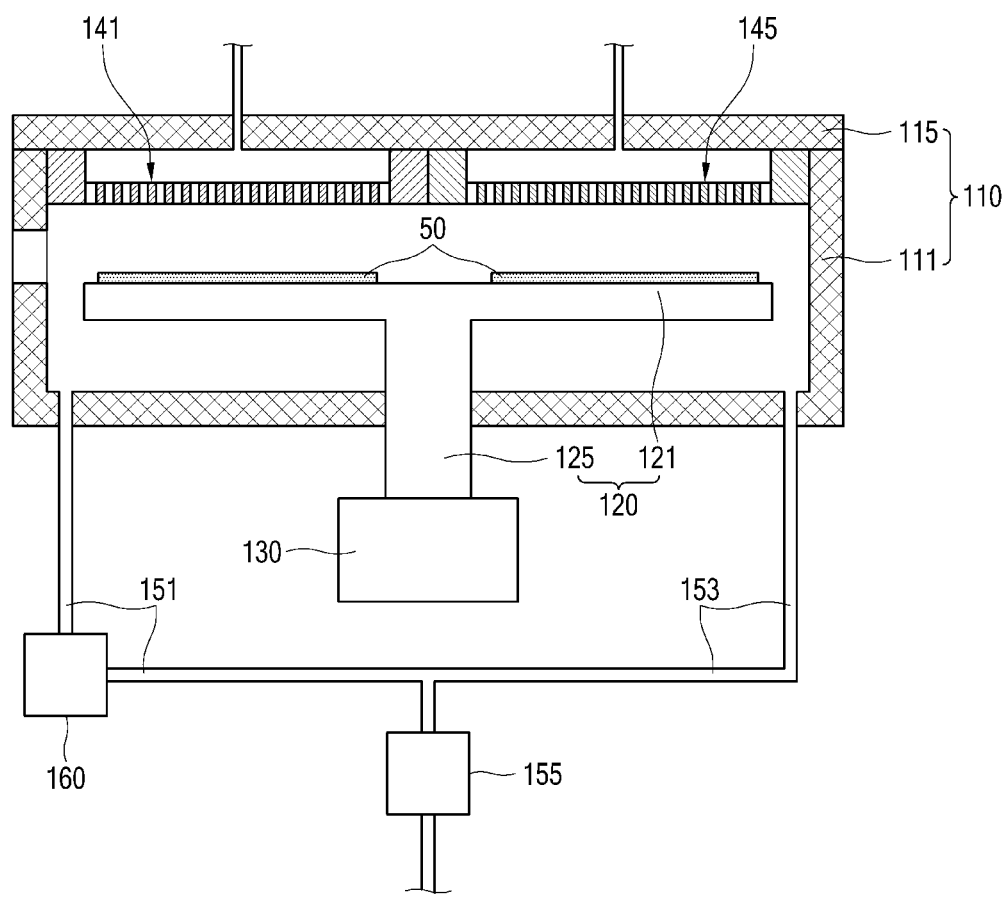
FIG. 1 is a schematic view illustrating a configuration of a substrate processing apparatus according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

In the specification, in adding reference numerals for elements in each drawing, it should be noted that like reference numerals already used to denote like elements in other drawings are used for elements wherever possible.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms.

It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

The term "and/or" should be understood as including any and all combinations of one or more of the associated listed items. For example, the meaning of "a first item, a second item, and/or a third item" denotes the combination of all items proposed from two or more of the first item, the second item, and the third item as well as the first item, the second item, or the third item.

It will also be understood that when an element is referred to as being 'on' another element, it can be directly on the other element, or intervening elements may also be present. Further, it will be understood that when an element is referred to as being 'under' another element, it can be directly under, and one or more intervening elements may also be present. In addition, it will also be understood that when an element is referred to as being 'between' two elements, it can be the only element between the two elements, or one or more intervening elements may also be present. Other terms for describing a relationship between elements, for example, "between" and "directly between" may be understood likewise.

In each of steps, reference numerals (for example, S100, S110, S120, etc.) are used for convenience of description, and do not define the order of the steps. Also, the steps may be performed in order different from a described order unless a specific order is clearly described contextually. That is, the steps may be performed in the described order, may be simultaneously performed, or may be performed in reverse order.

Hereinafter, a substrate processing apparatus having exhaust gas decomposer and an exhaust gas processing method therefor according to an embodiment of the present invention will be described in detail with reference to the accompanying drawings.

First, a substrate processing apparatus according to an embodiment of the present invention will be described.

Figure 2:
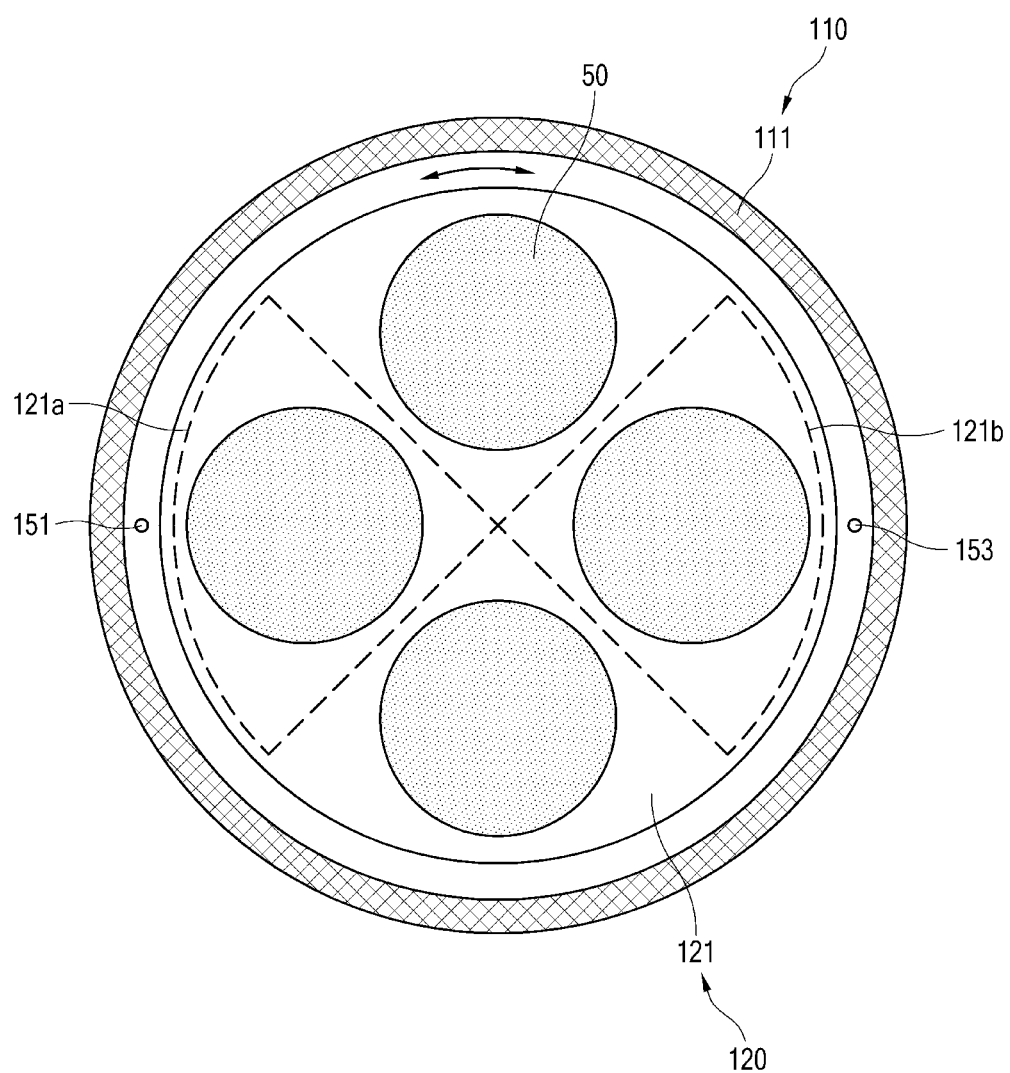
FIG. 2 is a plan cross-sectional view of FIG. 1.

FIG. 1 is a diagram illustrating a schematic configuration of a substrate processing apparatus according to an embodiment of the present invention, and FIG. 2 is a plan cross-sectional view of FIG. 1.

As illustrated, the substrate processing apparatus according to an embodiment of the present invention may include a process chamber 110 including a space into which a substrate 50 such as a silicon wafer, glass, or the like is loaded and processed. The process chamber 110 may include a body 111, which includes an opened top and is disposed on a relatively lower side, and a lid 115 which is coupled to the opened top of the body 111 and is disposed on a relatively upper side.

A substrate supporting means 120 on which the substrate 50 is mounted and supported may be installed on an inner lower surface of the process chamber 110. The substrate supporting means 120 may include a supporter 121, which is disposed in the process chamber 110 and includes a top on which the substrate 50 is mounted and supported, and a supporting shaft 125 which includes an upper end coupled to a bottom of the supporter 121 and a lower end exposed to the outside of a bottom of the process chamber 110 and connected to a driving part 130.

The substrate 50 may be provided in plurality. The plurality of substrates 50 may be radially mounted and supported on the supporter 121 with respect to a center of the supporter 121. The driving part 130 may raise, lower, or rotate the substrate supporting means 120. That is, the driving part 130 may raise, lower, or rotate the supporter 121 by raising, lowering, or rotating the supporting shaft 125. Therefore, the substrate 50 mounted and supported on the supporter 121 may be raised, lowered, or rotated.

A heating unit (not shown) such as a heater or the like for heating the substrate 50 may be installed near the supporter 121 on which the substrate 50 is mounted and supported.

In order to deposit a thin film on the substrate 50, a source gas which is a material deposited on the substrate 50 and a reactant gas which helps the source gas to be easily deposited on the substrate 50 may be supplied to the process chamber 110. To this end, a source gas distribution means 141 for distributing a source gas to the substrate 50 mounted on the supporter 121 and a reactant gas distribution means 145 for distributing the reactant gas to the substrate 50 may be installed on an inner upper surface of the process chamber 110.

The source gas distribution means 141 and the reactant gas distribution means 145 may each be provided as a shower head and may be mutually divided and installed. Also, the source gas distributed from the source gas distribution means 141 may be distributed to only a source gas area 121a opposite to the source gas distribution means 141, and the reactant gas distributed from the reactant gas distribution means 145 may be distributed to only a reactant gas area 121b opposite to the reactant gas distribution means 145. In this case, the source gas distributed from the source gas distribution means 141 and the reactant gas distributed from the reactant gas distribution means 145 may be distributed without being mixed with each other in the middle of being distributed to the substrate 50.

Therefore, as the substrate supporting means 120 rotates, the plurality of substrates 50 mounted and supported on the substrate supporting means 120 may be sequentially located in the source gas area 121a and may be sequentially located in the reactant gas area 121b. That is, when the substrate 50 which is located in the source gas area 121a and is supplied with the source gas is located in the reactant gas area 121b and is supplied with the reactant gas according to a rotation of the substrate supporting means 120, the source gas may be deposited on the substrate 50 by reaction between the source gas and the reactant gas.

Only the small amount of each of the source gas and the reactant gas supplied to the process chamber 110 may be used in a deposition process, and most of each of the source gas and the reactant gas may be emitted to outside the process chamber 110 along with a byproduct which occurs in the deposition process A source gas exhaust line 151, a reactant gas exhaust line 153, and an exhaust pump 155 may be provided for emitting the source gas and the reactant gas, which are not used in the deposition process, to outside the process chamber 110 along with the byproduct.

One end of the source gas exhaust line 151 may communicate with a bottom of the process chamber 110, and the other end of the source gas exhaust line 151 may communicate with the exhaust pump 155. One end of the reactant gas exhaust line 153 may communicate with the bottom of the process chamber 110, and the other end of the reactant gas exhaust line 153 may communicate with the exhaust pump 155. In this case, the one end of the source gas exhaust line 151 and the one end of the reactant gas exhaust line 153 may each communicate with the bottom of the process chamber 110 disposed just under the source gas area 121a and the reactant gas area 121b.

Therefore, when the exhaust pump 155 provided as a vacuum pump or the like is driven, a source gas which is distributed to the source gas area 121a but is not used in the deposition process may be extracted and may flow into the source gas exhaust line 151, and a reactant gas which is distributed to the reactant gas area 121b but is not used in the deposition process may be extracted and may flow into the reactant gas exhaust line 153. Subsequently, the source gas and the reactant gas may be changed to a mixed gas and may flow into the exhaust pump 155, and the mixed gas may be emitted to outside the exhaust pump 155 through the inside of the exhaust pump 155.

A source gas which is not used in the deposition process and flows into the exhaust pump 155 through the exhaust line 151 may react with heat occurring in the exhaust pump 155 or a reactant gas which flows into the exhaust pump 155 through the reactant gas exhaust line 153, and may be deposited on an inner surface of the exhaust pump 155. For this reason, the exhaust pump 155 can be damaged. Particularly, when a source gas is for a low temperature, a source gas piled in the exhaust pump 155 can be exploded by heat which occurs in the exhaust pump 155.

In order to prevent such problems, the substrate processing apparatus according to an embodiment of the present invention may include an exhaust gas decomposition module 160 which decomposes a source gas flowing into the source gas exhaust line 151.

The exhaust gas decomposition module 160 may be installed near the source gas exhaust line 151 between the process chamber 110 and the exhaust pump 155 and may decompose the source gas flowing into the source gas exhaust line 151. In this case, the exhaust gas decomposition module 160 may decompose a ligand of the source gas, and the ligand-decomposed source gas may be supplied to the exhaust pump 155.

Since the ligand and the ligand-decomposed source gas are in an unstable state, it is required to stabilize the ligand and the ligand-decomposed source gas. To this end, $O_2$, $N_2O$, or $O_3$ may be supplied to source gas exhaust line 151 between the exhaust gas decomposition module 160 and the exhaust pump 155. Therefore, the ligand and the ligand-decomposition module source gas may be put in a stabilized state by reacting with $O_2$, $N_2O$, or $O_3$.

Subsequently, the ligand and the ligand-decomposed source gas may be changed to a mixed gas including a reactant gas of the reactant gas exhaust line 153 mixed therewith. Therefore, the ligand and the ligand-decomposed source gas may not react with the reactant gas or heat which occurs in the exhaust pump 155, and thus, the ligand-decomposed source gas and the ligand flowing into the exhaust pump 155 are not deposited on an inner surface of the exhaust pump 155. Also, the ligand-decomposed source gas and ligands piled in the exhaust pump 155 are not exploded.

In this case, the exhaust gas decomposition module 160 may be provided as a plasma generator, which generates plasma to decompose a source gas, or a heat source which heats and decomposes the source gas.

Figure 3:
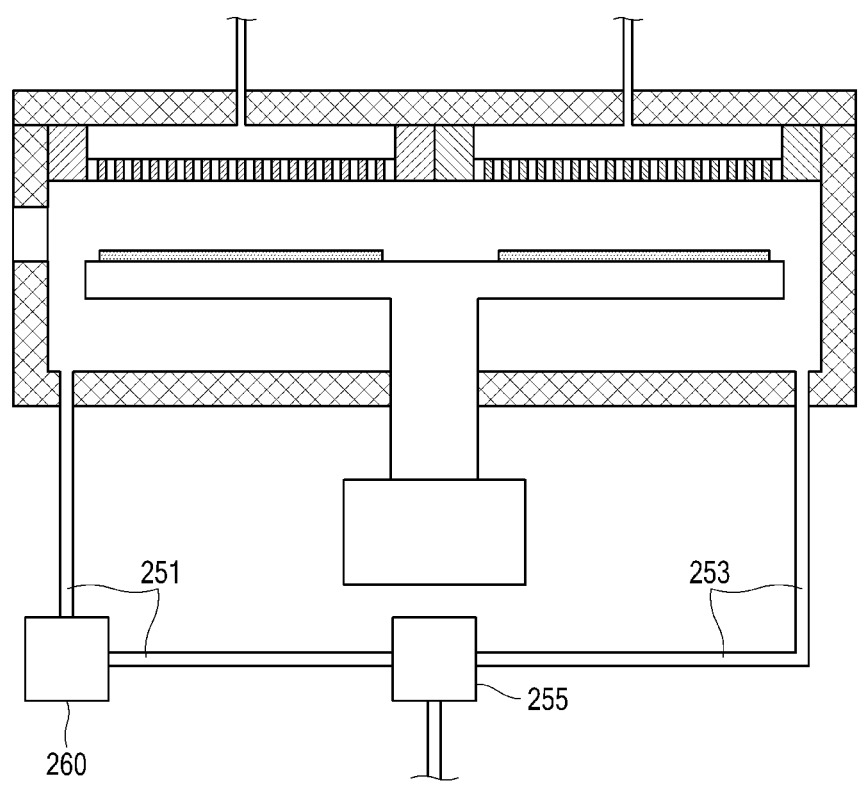
FIG. 3 is a schematic view illustrating a configuration of a substrate processing apparatus according to another embodiment of the present invention.

FIG. 3 is a diagram illustrating a schematic configuration of a substrate processing apparatus according to another embodiment of the present invention. Only a difference between FIG. 3 and FIG. 1 will be described below.

As illustrated, in the substrate processing apparatus according to another embodiment of the present invention, a ligand of a source gas exhaust line 251 decomposed by an exhaust gas decomposition module 260, a ligand-decomposed source gas, and a reactant gas of a reactant gas exhaust line 252 may flow into an exhaust pump 255, and then, may be mixed with each other in the exhaust pump 255. Subsequently, the mixed gas may be emitted to outside the exhaust pump 255.

Hereinafter, an exhaust gas processing method of a substrate processing apparatus according to the present embodiment will be described with reference to FIGS. 1 to 4. FIG. 4 is a flowchart illustrating an exhaust gas processing method of a substrate processing apparatus according to an embodiment of the present invention.

As illustrated, a source gas and a reactant gas, which is not used in the deposition process of depositing a thin film on the substrate 50, in a source gas and a reactant gas distributed to the process chamber 110 may be respectively supplied to the source gas exhaust line 151 and the reactant gas exhaust line 153 and may be emitted to outside the process chamber 110 in step S110.

As described above, one side of the source gas exhaust line 151 may communicate with the process chamber 110, and the other side may communicate with the exhaust pump 155. Also, one side of the reactant gas exhaust line 153 may communicate with the process chamber 110, and the other side may communicate with the exhaust pump 155. Therefore, when the exhaust pump 155 is driven, the source gas and the reactant gas of the process chamber 110 may be respectively extracted and exhausted to the source gas exhaust line 151 and the reactant gas exhaust line 153.

Subsequently, in step S120, the source gas flowing into the source gas exhaust line 151 may be decomposed by the exhaust gas decomposition module 160. Also, in step S130, the decomposed source gas of the source gas exhaust line 151 and the reactant gas of the reactant gas exhaust line 153 may be changed to a mixed gas through mixing. Subsequently, in step S140, the mixed gas may be emitted to the outside through the inside of the exhaust pump 155.

In this case, the exhaust gas decomposition module 160 may be a plasma generator which generates plasma to decompose a source gas, or may be a heat source which heats and decomposes the source gas. Also, a ligand may be separated from the source gas of the source gas exhaust line 151.

As described above, the ligand and the ligand-decomposed source gas may be put in a stabilized state by reacting with separately supplied $O_2$, $N_2O$, or $O_3$, may be mixed with the reactant gas of the exhaust pump 155, may flow into the exhaust pump 155, and may be emitted. Alternatively, the ligand and the source gas may be mixed with the reactant gas of the reactant gas exhaust line 153 in the exhaust pump 155 and may be emitted.

In the substrate processing apparatus and the method of processing an exhaust gas according to the present embodiment, the exhaust gas decomposition module 160 (260) may decompose a ligand of a source gas. Subsequently, the ligand, the ligand-decomposed source gas, and a reactant gas of the reactant gas exhaust line 153 (253) which have been stabilized may be changed to a mixed gas. The mixed gas may flow into the exhaust pump 155 (255) and may be emitted, or the ligand and the ligand-decomposed source gas may be mixed with the reactant gas in the exhaust pump 155 (255) and may be emitted. Therefore, the ligand and the ligand-decomposed source gas may not react with the reactant gas or heat which occurs in the exhaust pump 155 (255), and thus, the ligand-decomposed source gas and the ligand flowing into the exhaust pump 155 (255) are not deposited on an inner surface of the exhaust pump 155 (255). Also, the ligand-decomposed source gas and ligands piled in the exhaust pump 155 (255) are not exploded.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A substrate processing apparatus comprising:
   a process chamber including a space where a substrate is processed;
   a substrate supporting means installed in the process chamber, the substrate being disposed on the substrate supporting means;
   a source gas distribution means distributing a source gas to only a source gas area;
   a reactant gas distribution means distributing a reactant gas to only a reactant gas area, the reactant gas and the source gas are distributed without being mixed with each other in the middle of being distributed to the substrate;
   an exhaust pump exhausting the source gas and a reactant gas to outside the process chamber,
   a source gas exhaust line guiding the source gas, which is distributed to the source gas area but is not used in a deposition process; and
   a reactant gas exhaust line guiding the reactant gas, which is distributed to the reactant gas area but is not used in the deposition process,
   wherein a first end of the source gas exhaust line communicates with the source gas area, and a second end of the source gas exhaust line communicates with the exhaust pump,
   wherein a first end of the reactant gas exhaust line communicates with the reactant gas area, and a second end of the reactant gas exhaust line communicates with the exhaust pump,
   wherein the source gas exhaust line is configured to be supplied one material selected from among $O_2$, $N_2O$, and $O_3$ so that the source gas of the source gas exhaust line reacts with one material selected from among $O_2$, $N_2O$, and $O_3$ between the first end of the source gas exhaust line and the second end of the source gas exhaust line and then is mixed with the reactant gas of the reactant gas exhaust line.

2. The substrate processing apparatus of claim 1, wherein the source gas of the source gas exhaust line is stabilized by reacting with one material selected from among $O_2$, $N_2O$, and $O_3$ supplied to the source gas exhaust line and flows into the exhaust pump.

3. The substrate processing apparatus of claim 1, wherein,
   the source gas of the source gas exhaust line is stabilized by reacting with one material selected from among $O_2$, $N_2O$, and $O_3$ supplied to the source gas exhaust line and is mixed with the reactant gas of the reactant gas exhaust line,
   a mixed gas including a stabilized source gas and the reactant gas flows into the exhaust pump.

4. The substrate processing apparatus of claim 1, wherein the source gas of the source gas exhaust line is stabilized by reacting with one material selected from among $O_2$, $N_2O$, and $O_3$ supplied to the source gas exhaust line and is mixed with the reactant gas of the reactant gas exhaust line in the exhaust pump.

5. The substrate processing apparatus of claim 1, wherein,
   a ligand of the source gas of the source gas exhaust line is decomposed, and
   the ligand and a ligand-decomposed source gas of the source gas exhaust line are stabilized by reacting with one material selected from among $O_2$, $N_2O$, and $O_3$.

6. The substrate processing apparatus of claim 1, wherein,
the first end of the source gas exhaust line communicates with a bottom on the process chamber disposed just under the source gas area, and
the first end of the reactant gas exhaust line communicates with a bottom on the process chamber disposed just under the reactant gas area.

\* \* \* \* \*